United States Patent [19]

Grube et al.

[11] Patent Number: 5,086,558
[45] Date of Patent: Feb. 11, 1992

[54] DIRECT ATTACHMENT OF SEMICONDUCTOR CHIPS TO A SUBSTRATE WITH A SUBSTRATE WITH A THERMOPLASTIC INTERPOSER

[75] Inventors: Gary W. Grube, Washingtonville; Igor Y. Khandros, Peekskill, both of N.Y.

[73] Assignee: International Business Machines Corporation, Armonk, N.Y.

[21] Appl. No.: 581,854

[22] Filed: Sep. 13, 1990

[51] Int. Cl.⁵ .............................................. H05K 3/34
[52] U.S. Cl. ...................................... 29/832; 29/840; 29/841
[58] Field of Search ................ 29/832, 840, 842, 843, 29/841

[56] References Cited

U.S. PATENT DOCUMENTS 4,179,802  12/1979  Joshi et al. .
4,642,889  2/1987   Grabbe .
4,648,179  3/1987   Bhattacharyya et al. .
4,926,051  5/1990   Turnbull ........................ 29/832 X

FOREIGN PATENT DOCUMENTS 3127120  1/1983  Fed. Rep. of Germany ........ 29/832
0037577  3/1979  Japan ..................................... 29/832

OTHER PUBLICATIONS

Takeuchi et al., "A Technology for High Density Mounting Utilizing Polymeric Multilayer Substrate," IEEE/CHMT '89 Japan IEMT Symposium.
Gilleo, "Direct Chip Interconnect Using Polymer Bonding," *IEEE Trans. Comp., Hybrids, Manuf. Technol.*, vol. 13, No. 1, Mar. 1990.

*Primary Examiner*—Timothy V. Eley
*Attorney, Agent, or Firm*—Scully, Scott, Murphy & Presser

[57] ABSTRACT

A method for the direct attachment of semiconductor chips to a substrate or module with a polymer interposer. Initially, an interposer sheet is fabricated, which is to be positioned between the chips and the substrate, with via patterns conforming to the contact patterns of the chips. The interposer sheet comprises a sheet of dielectric thermoplastic material selected from an elastomer, a filled elastomer, a polymer, or a copolymer. The chips are then placed on the interposer sheet with each chip being positioned on a conforming via pattern, and the chips are attached to the interposer sheet, as with a suitable adhesive. The vias are then filled with a conductive attachment material comprising a solution of a themoplastic polymer, preferably a copolymer of polyimide and siloxane, and a fine metal, preferably gold, forming a paste. The interposer sheet with the attached chips is then diced into individual chips, with each chip having a section of the interposer sheet attached thereto. The chips with attached interposer are then directly attached to a substrate or module, with the interposer therebetween, by applying heat and pressure, and the substrate provides a controlled joint height and encapsulated joints.

19 Claims, 4 Drawing Sheets

1. PASTE BUMPS PICKED-UP BY SILICONE PAD

2. BUMPS REMAIN ON PAD

3. BUMPS ARE TRANSFERED ONTO A SUBSTRATE

FIG. 7

DIRECT ATTACHMENT OF SEMICONDUCTOR CHIPS TO A SUBSTRATE WITH A SUBSTRATE WITH A THERMOPLASTIC INTERPOSER

BACKGROUND OF THE INVENTION

1. Field of the Invention

The present invention relates generally to the direct attachment of semiconductor chips to a substrate or module with the use of a thermoplastic interposer therebetween. More particularly, the subject invention pertains to the direct attachment of semiconductor chips to a substrate or module with a thermoplastic polymer interposer and a joining material preferably formed of a composite of a thermoplastic polymer such as a copolymer of polyimide and siloxane and a fine metal such as gold powder.

2. Discussion of the Prior Art

Direct chip attachment of semiconductor chips to multichip modules has been practiced commercially, and offers obvious advantages in terms of density and performance. Although there are advantages to direct chip attachment on multilayer ceramic (MLC) modules, there are also disadvantages associated therewith. High temperature solder is normally used for reliability related reasons for the electrical connections, with the joining temperature cycling up to 370° C., which limits the choice of materials which can be used in the components, particularly with respect to polymers.

Burn-in and testing of multichip modules is performed on a module populated with many chips. This results in a great deal of rework, and subsequent solder reflows over the entire module substrate, generally for the purpose of reattaching only one or two chips. Therefore, the multichip module, including metallurgies on both chip and substrate sides thereof, is required to be designed to withstand ten to twenty reflow cycles. Accordingly, although this technology offers a number of advantages, it also has a number of disadvantages associated therewith.

The present invention incorporates some of the advantages of this existing technology which can use a controlled collapse chip connection (C-4) pattern on the chips, while alleviating several of the problems associated therewith.

Several U.S. Patents have been evaluated as prior art relative to the present invention, but all are quite distinct for the following reasons. U.S. Pat. No. 4,648,179 fabricates an interconnection layer which is bonded to a module, but does not disclose or teach chip interconnection/encapsulation. U.S. Pat. No. 4,179,802 uses metal studs that have been electroplated, and uses small amounts of solder to make the electrical connections which are essentially direct stud connections. In contrast thereto, the present invention preferably uses a metal-polymer composite to provide the electrical connections, and provides encapsulated connections joining the chip to the substrate. U.S. Pat. No. 4,642,889 uses fine wires which are positioned within a paper interposer surrounded by solder and flux, which are then heated and melted to make the electrical connections. Afterwards, the paper interposer is totally removed by dissolving it in a washing operation. In contrast thereto, the present invention uses the interposer to both join and encapsulate the chip to a substrate or module.

SUMMARY OF THE INVENTION

Accordingly, it is a primary object of the present invention to provide for the direct attachment of semiconductor chips to a substrate or module with the use of a thermoplastic interposer therebetween.

A further object of the subject invention is the provision of fluxless, low temperature, direct chip to substrate attachment compatible with chip burn-in and resulting in joint encapsulation. The present invention provides a fluxless, low temperature, direct chip attachment method and structure based upon the use of a diceable thermoplastic interposer permanently attached to a chip which:

provides well controlled and easily adjusted contact joint heights;

produces encapsulated contact joints with increased resistance against thermal fatigue failure;

facilitates temporary contact for chip burn-in with a flat interposer and with substantially no C-4 pattern height variation;

can be used with a variety of joining metallurgies, including a poly[imide-siloxane]/gold composite which does not require the use of a flux, or with solder or other suitable materials;

reduces traditional requirements imposed on contact metallurgies for C-4 patterns, thus reducing bonding, assembly and testing costs for direct chip attachment; and is inexpensive and easily manufacturable.

In accordance with the teachings herein, the present invention provides a method of direct attachment of semiconductor chips to a substrate or module. In a preferred embodiment disclosed herein, a plurality of chips are prepared for subsequent attachment to a substrate or module by starting with a large interposer sheet to which a plurality of chips are attached and which is subsequently diced to form individual chips, each having a section of the interposer sheet attached thereto. However, the present invention is also applicable to the preparation of a single chip with a corresponding interposer prepared as described herein. In the disclosed embodiment wherein a plurality of chips are prepared on an interposer sheet, initially, the interposer sheet is fabricated, which is to be positioned between the chips and the substrate, with via patterns therein conforming to the contact patterns of the chips. The chips are then placed on the interposer sheet with each chip being positioned over a conforming via pattern, and the chips are attached to the interposer sheet, as with a suitable adhesive. The vias are then filled with a conductive attachment material. The interposer sheet with the attached chips is then diced into individual chips, with each chip having a section of the interposer sheet attached thereto. The chips with attached interposer are then directly attached to a substrate or module, with the interposer therebetween, by applying heat and pressure, and the interposer provides a controlled contact joint height and encapsulated contact joints.

In greater detail, in preferred embodiments the vias are filled with a conductive attachment composite material comprising a thermoplastic solution of a thermoplastic polymer, preferably a copolymer of polyimide and siloxane, and a fine metal, preferably gold, forming a paste. The interposer sheet comprises a sheet of thermoplastic dielectric material selected from an elastomer, a filled elastomer, a thermoplastic polymer, or a thermoplastic copolymer, and the interposer sheet and conductive attachment material are preferably selected to have matching properties, particularly with respect to their coefficients of thermal expansion. In the fabrication of the interposer sheet, the sheet can be preferably laser ablated, or alternatively punched or drilled, to create via patterns matching the contact patterns of the chips. The chips are attached to the interposer sheet with a first adhesive, and the chips are attached to the substrate or module with a second adhesive which is not as strong in bonding strength as the first adhesive. This feature provides for rework in which the second adhesive is ruptured to detach the chip from the substrate or module while the first adhesive remains intact.

Following the step of filling the vias with a conductive attachment material, the chips may be burned-in and tested by contacting a burn-in module. The burn-in module is provided with a bump for each via, and the radius of each bump on the burn-in module is preferably larger than the radius of bumps of conductive attachment material provided on the substrate to ensure adequate composite flow during the step of direct attachment of the chips to the substrate or module.

BRIEF DESCRIPTION OF THE DRAWINGS

The foregoing objects and advantages of the present invention for direct attachment of semiconductor chips to a substrate with a thermoplastic interposer may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE DRAWINGS

Figure 1:
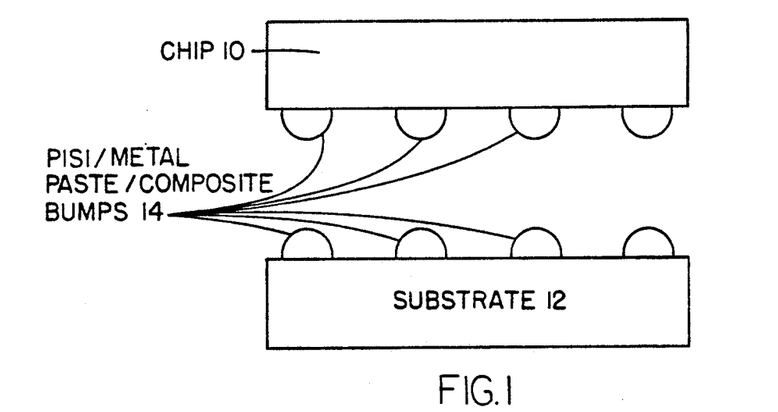
FIG. 1 illustrates a method for joining a semiconductor chip to a substrate utilizing a poly[imidesiloxane]/gold composite joining material which does not use solder and is fluxless, and in which joining is performed above Tg (the glass transition temperature) of the composite copolymer.

FIG. 1 illustrates a method for joining a semiconductor chip 10 to a substrate or module 12 utilizing a poly[imide-siloxane]/gold composite joining material which is applied as patterns of C-4 bumps 14 on both the chip and the substrate. Advantageously, this method does not use solder and is fluxless, and joining is performed above Tg (the glass transition temperature) of the composite copolymer. In such a direct chip attachment method, pressure is applied between the chip and module during the joining process. With this approach, it is difficult to precisely control the height of each contact bump forming each electrical contact joint, which in turn can result in an increase in effective thermal fatigue stresses.

Figure 2:
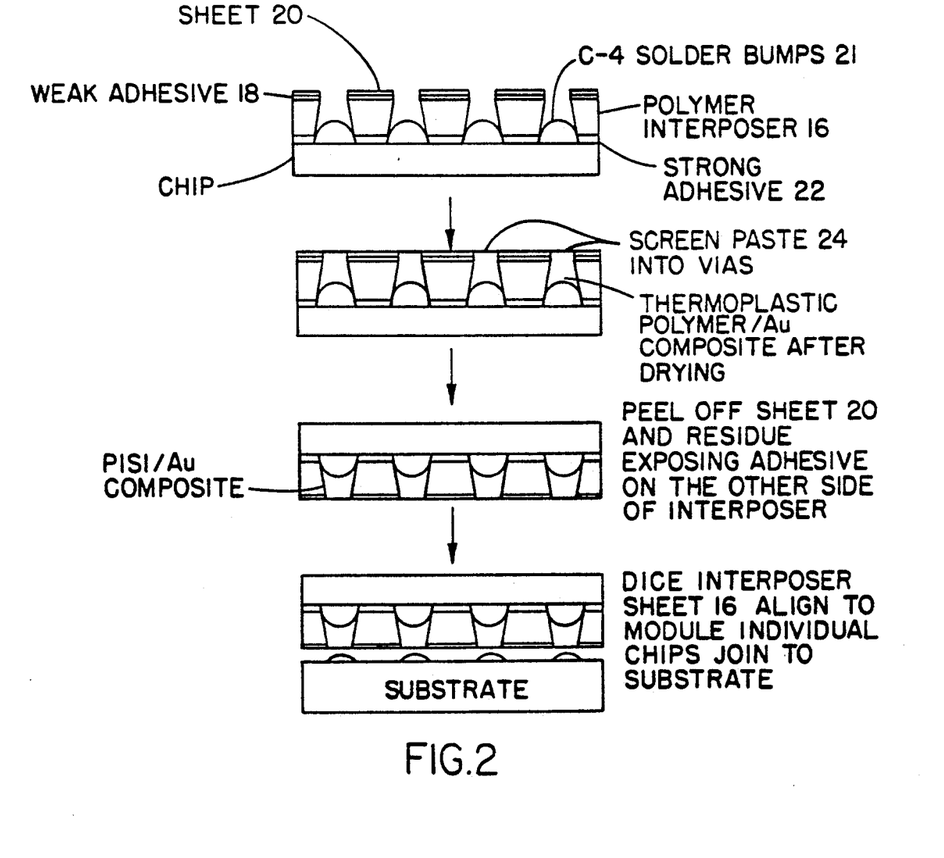
FIG. 2 shows the sequence of steps involved in the use of an interposer pursuant to the teachings of the present invention, which provides controlled joint height and joint encapsulation, and in which a poly[imide-siloxane]/gold composite paste is used as the electrical/mechanical attachment material.

The present invention allows the electrical contact joint heights to be precisely controlled by introducing an interposer 16 between the semiconductor chip and the substrate or module. FIG. 2 shows the sequence of steps involved in using an interposer pursuant to the teachings of the present invention, which provides controlled joint height and joint encapsulation, and in which a poly[imide-siloxane]/gold composite paste is used as the electrical/mechanical attachment material.

The interposer 16 can be fabricated from a sheet, typically 8 to 10 mils thick, of a thermoplastic dielectric material. The interposer 16 is thermoplastic to facilitate the initial attachment process and also to provide for rework and detachment of a chip from the substrate or module, and is dielectric to electrically insulate the electrical contact joints. The interposer sheet can be fabricated from a thermoplastic dielectric elastomer such as silicone, a filled elastomer for dimensional control (with typical fillers being dielectrics such as glass, ceramic, aluminum nitride or any other suitable dielectric filler material), a thermoplastic dielectric polymer or copolymer such as polyimide and siloxane, or other various polymers and copolymers. A copolymer of polyimide and siloxane, as is available commercially from General Electric, is preferred wherein siloxane is present in 10 to 20% of the molecular chain, and provides an adhesive quality for the copolymer.

Initially, a large area interposer sheet is fabricated with a layer of a relatively weak adhesive 18 covered by a peel off sheet 20 on one side and a layer of a stronger adhesive 22 on the opposite side. The interposer sheet is then preferably laser ablated, or alternatively punched or drilled, for personalization to create via patterns conforming to the C-4 patterns of chips to be joined, with each via typically having a diameter between 200 and 250 microns. Chips with solder bumps 21, as in FIG. 2, or with composite bumps 23 as in FIG. 3, are then placed on top of the strong adhesive layer 22 on the interposer sheet with the solder or composite bumps being positioned in the vias without a requirement for precise alignment, and permanently adhere to the adhesive on top of the interposer sheet with a strong adhesion.

The direct chip attachment is preferably accomplished with a thermoplastic polymer such as the copolymer poly[imidesiloxane] mixed with a conductive fine metal to form a composite paste 24. The paste 24 can consist of a solution of a thermoplastic polymer, preferably, but not limited to, a copolymer of polyimide and siloxane mixed with fine metal, preferably gold, or gold coated metal, polymer or ceramic, to form a screenable paste. The metal provides conductivity for the electric contact joints and can be any suitable fine metal such as gold or silver. Gold is preferred, as product 1800 powder available from Metz Metallurgical Corp., South Plainfield, N.J. 07080, which is a coprecipitated sphere and flake mixture having a 2.2 u average particle size. The gold powder is preferably mixed with a polyimide and siloxane copolymer having from 30% to 70%, preferably 50%, gold powder by volume Poly[imide-siloxane] copolymers that have been used for joining have Tg's varying between 100 and 250° C., with joining temperatures ranging from 200 to 380° C.

The interposer sheet populated with chips prepared as indicated hereinabove is then turned over to the position illustrated in the top of FIG. 2, and the composite paste 24 is screened into the vias and the excess paste wiped off as shown in the second stage of FIG. 2. The paste residue is then removed by peeling off the sheet 20, thereby exposing the weak adhesive 18 as shown in the third stage of FIG. 2. The interposer sheet with chips thereon can then be diced, and the chips with interposers at the bottom are then individually attached, as illustrated in the fourth stage of FIG. 2 and also in FIGS. 3 and 4.

Figure 3:
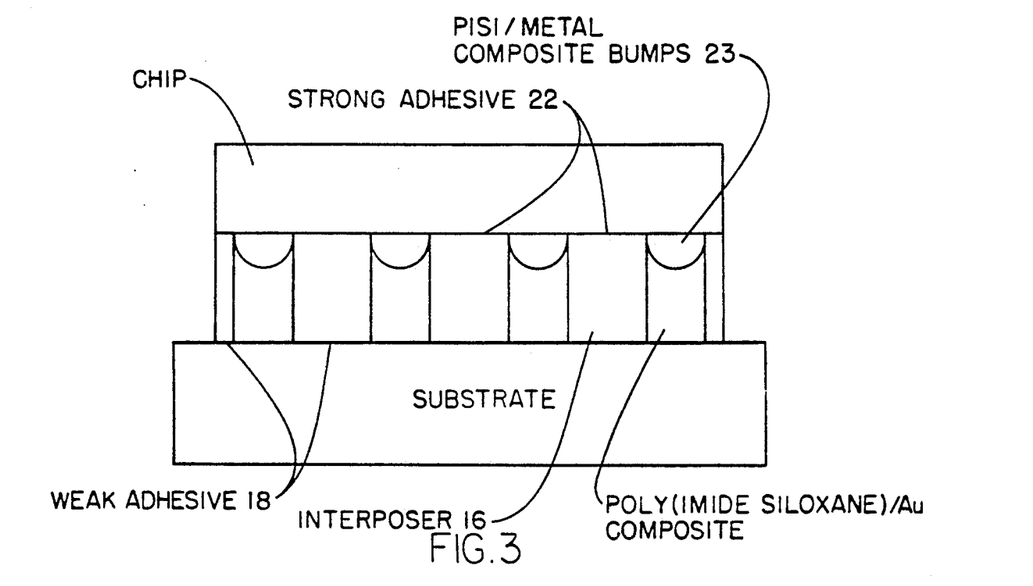
FIG. 3 shows the direct attachment of a composite bumped chip to a substrate with an interposer therebetween and a poly[imide-siloxane]/gold composite joining material, and also shows the hierarchy of adhesives provided for rework.
Figure 4:
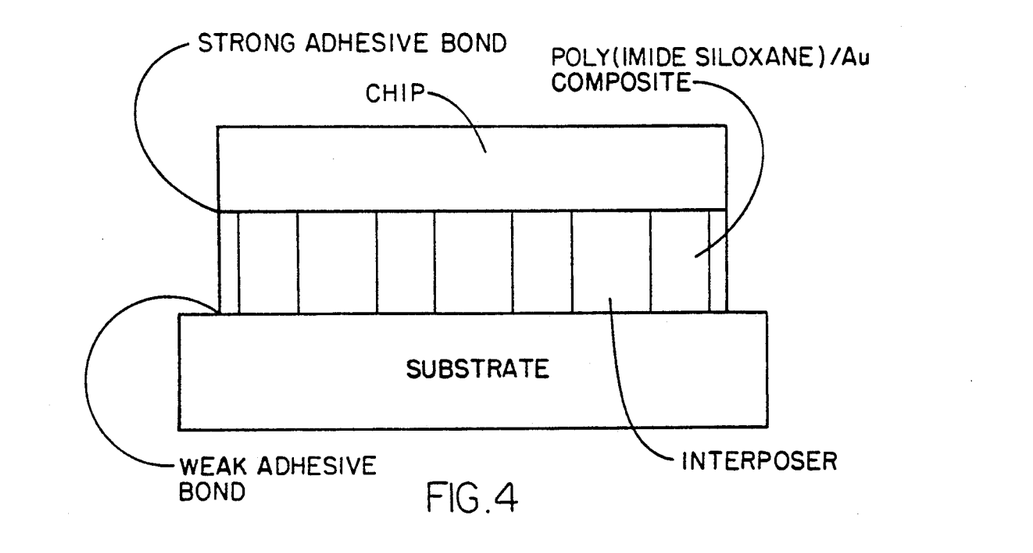
FIG. 4 illustrates the direct attachment of a chip without solder or composite bumps to a substrate with an interposer therebetween and a poly[imide-siloxane]/gold composite joining material which provides solderless, fluxless, encapsulated joints.

FIG. 3 shows the direct attachment of a composite bumped 23 chip with an interposer and a poly[imide-siloxane]/gold composite, and also shows the hierarchy of adhesives provided for rework. FIG. 4 illustrates the direct attachment of a chip without solder or composite bumps to a substrate with an interposer and a poly[imide-siloxane]/gold composite which provides solderless, fluxless, encapsulated joints. An advantage of the embodiment of FIG. 4 is that the step of applying solder or composite contact bumps to the chips is eliminated.

Either subsequent to dicing or prior to dicing, the interposer sheet can be used to burn-in and electrically test the chips by contacting a burn-in module 25, which could be a multilayer ceramic (MLC) burn-in module. The simultaneous contact of pads on a module is possible because of the designed flat bottom of the interposer sheet. The C-4 pattern ball height variations, which might occur in the structure of FIG. 1, has thus been eliminated.

Figure 5:
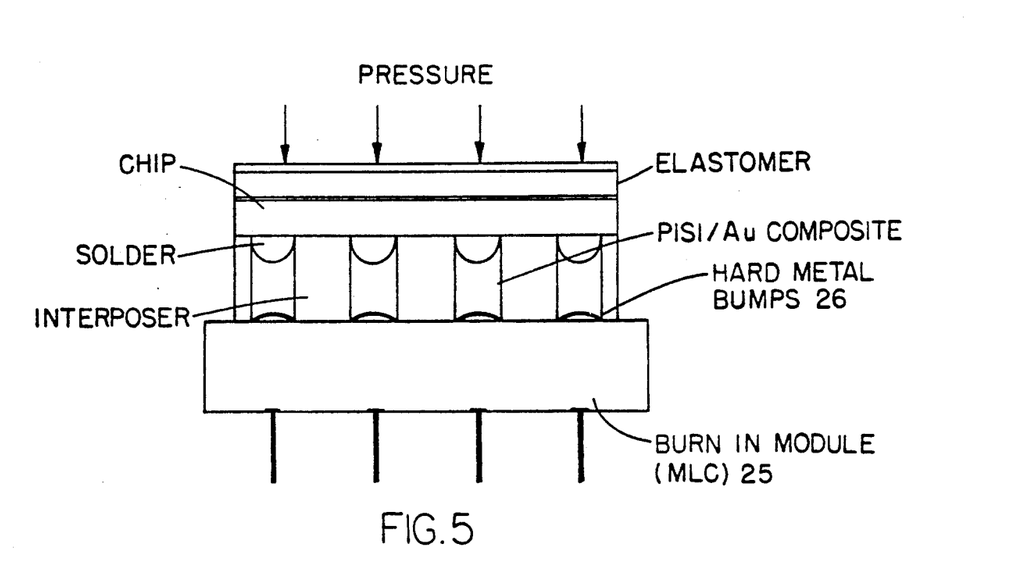
FIG. 5 depicts a burn-in of a chip on a thermoplastic interposer by temporary mechanical contact with a burn-in module.
Figure 6:
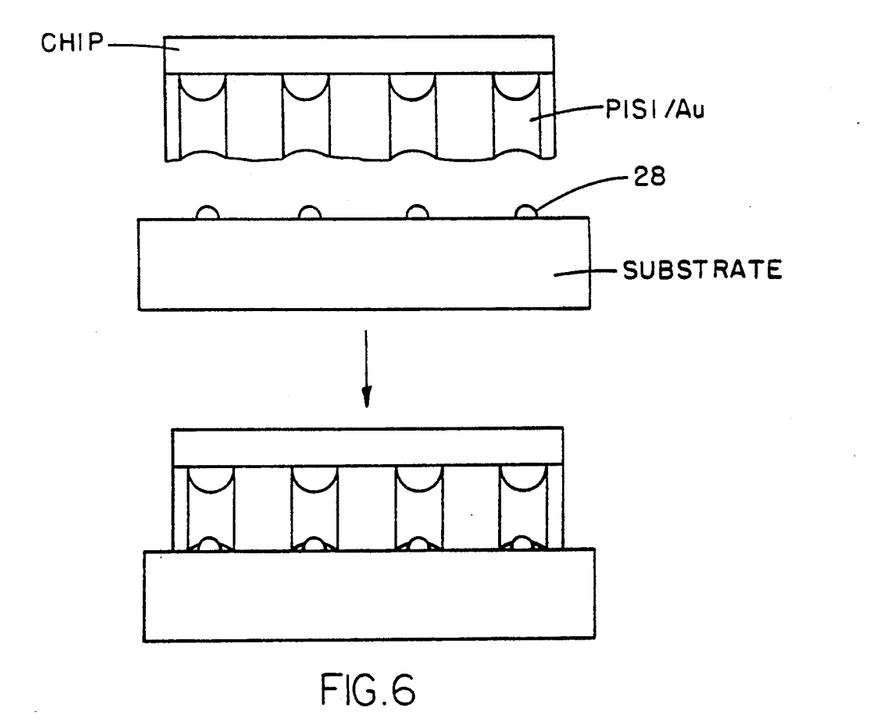
FIG. 6 shows the attachment of a burned-in chip, diced from the interposer sheet, to a multichip module.

FIG. 5 depicts a burn-in of chips on an interposer by temporary mechanical contact with an MLC burn-in module 25. Following the burn-in, and as described hereinabove, the interposer sheet with chips is diced, and the individual chips are ready for direct chip attachment as shown in FIGS. 2, 3 and 4. To ensure reliable bonding with metallurgy filled vias, preferably with a poly[imide-siloxane]/gold composite, the radius of bumps 26 on the burn-in module 25 should be larger than the radius of paste bumps 28 on the substrate, as shown in FIG. 6, which illustrates the attachment of burned-in chips diced from the interposer to a multichip module. The larger radius ensures an adequate amount of composite flow during the direct chip attachment.

The interposer structure is also compatible with and in alternative embodiments can be used with a metal solder via fill instead of a conductive composite via fill, but is limited to fluxes which do not chemically react with and alter the material of the interposer. The metal solder can be applied using a solder wave and related techniques. The use of a low temperature solder in the vias ensures low temperature attachment to a substrate.

The properties of the interposer material are preferably selected to match those of the poly[imidesiloxane]/-gold composite or other joining material used in conjunction with the interposer, particularly with respect to their coefficients of thermal expansion, such that the interposer also functions as an effective encapsulant. Preferably, both are formed of the same polymer such as the copolymer polyimide and siloxane. With such matching properties, the interposer distributes the stresses along the entire chip/substrate area, effectively lowering stresses on the joints, which has proven to significantly increase resistance to thermal fatigue.

Considering and providing for rework, two adhesives 18 and 22 are employed in the joining process, as shown in FIGS. 2, 3 and 4. The adhesive 22 between the chip and the interposer is selected to have a higher bonding strength than the adhesive 18 between the interposer and the substrate. As a result, when a chip is being removed for rework, the interposer/substrate interface is always the one to fracture. Any remaining adhesive can be removed by locally wiping the residual paste and polymer with a solvent. In embodiments wherein no adhesive is used between the interposer and the substrate, and the substrate/interposer joining is by the thermoplastic and adhesive properties of the interposer material, the soluble polymer is removed in the same fashion.

Figure 7:
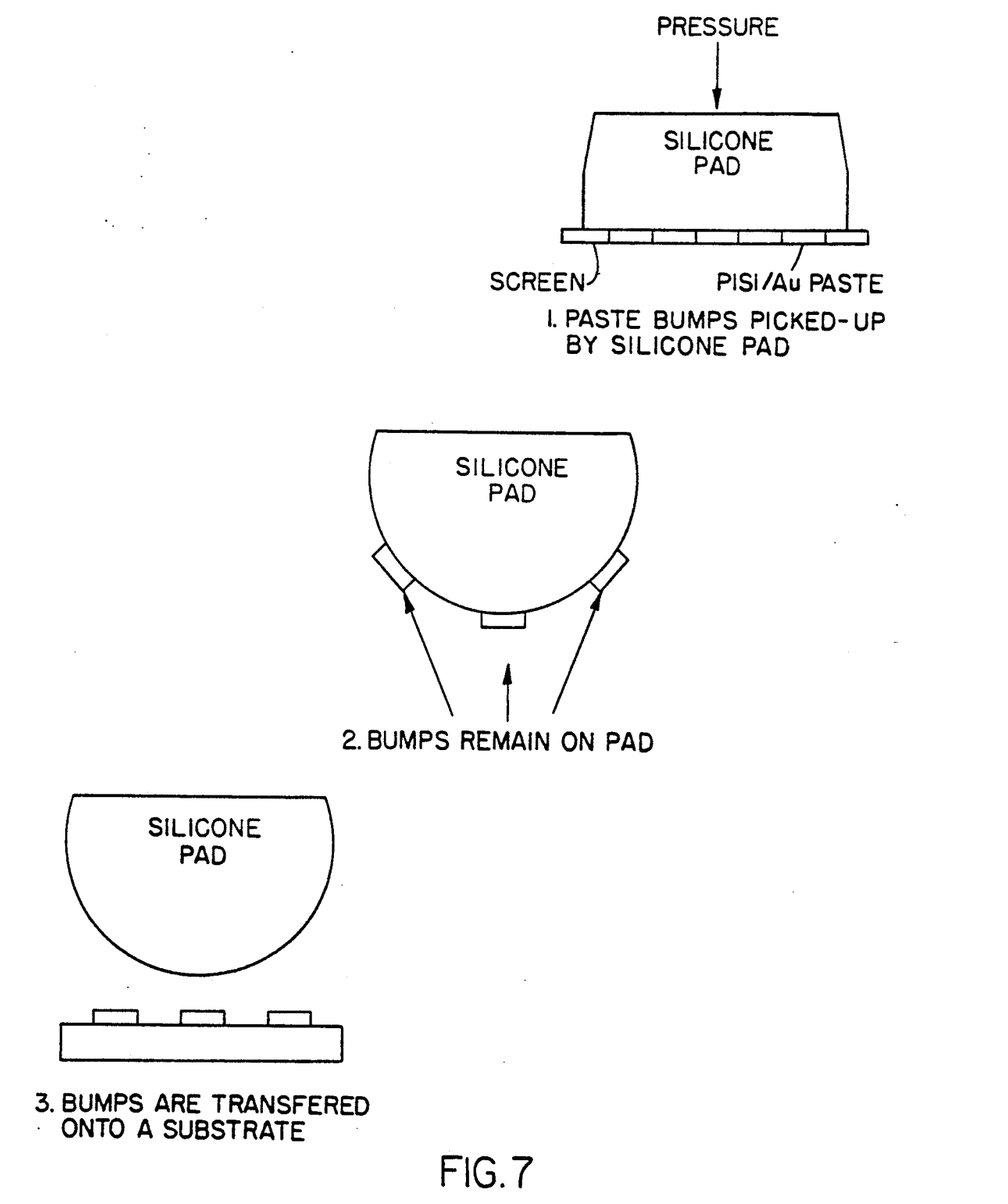
FIG. 7 illustrates a method of locally reapplying a composite joining material paste pattern to a substrate for attachment of a replacement chip during rework.

To join a replacement chip, a pattern of poly[imidesiloxane]/ gold paste can be applied locally to a substrate or module. This is difficult to do by screening. However, the pattern can be applied by a silicon pad, which picks up the wet pattern through a screen, and deposits it locally onto C-4 pattern pads, as depicted in FIG. 7, which illustrates a method of locally reapplying a paste pattern to a substrate.

While several embodiments and variations of the present invention for direct attachment of semiconductor chips to a substrate with a thermoplastic interposer are described in detail herein, it should be apparent that the disclosure and teachings of the present invention will suggest many alternative designs to those skilled in the art.

What is claimed is:

1. A method of direct attachment of at least one semiconductor chip to a substrate or module, comprising:
    a. fabricating a thermoplastic and dielectric interposer, which is to be positioned between a chip and the substrate, with a via pattern matching the contact pattern of the chip;
    b. placing the chip on the interposer with the contact pattern of the chip being positioned on the matching via pattern, and attaching the chip to the interposer;
    c. filling the vias of the interposer with a conductive attachment material; and
    d. directly attaching the chip with attached interposer to a substrate or module, with the interposer therebetween, with the interposer providing a controlled join height and providing encapsulated joints.

2. A method of direct attachment of at least one semiconductor chip to a substrate or module as claimed in claim 1, wherein:
    a. said step of fabricating comprises fabricating a thermoplastic and dielectric interposer sheet, which is to be positioned between a plurality of chips and the substrate, with via patterns matching the contact patterns of the chips;
    b. said step of placing comprises placing the plurality of chips on the interposer sheet with each chip being positioned on a matching via pattern, and attaching the plurality of chips to the interposer sheet;

c. said step of filling comprises filling the vias on the interposer sheet with a conductive attachment material; and d. dicing the interposer sheet with the attached plurality of chips into individual chips, with each chip having a section of the interposer sheet attached hereto.

3. A method of direct attachment of at least one semiconductor chip to a ;substrate or module as claimed in claim 2, wherein the vias are filled with a conductive attachment material comprising a solution of a thermoplastic polymer and a conductive fine metal forming a paste.

4. A method of direct attachment of at least one semiconductor chip to a substrate or module as claimed in claim 3, wherein the conductive attachment material comprises a copolymer of polymide and siloxane.

5. A method of direct attachment of at least one semiconductor chip to a substrate or module as claimed in claim 4, wherein the conductive fine metal comprises gold.

6. A method of direct attachment of at least one semiconductor chip to a substrate or module as claimed in claim 2, wherein the interposer sheet is formed of a material selected from an elastomer, a filled elastomer, a thermoplastic polymer, and a thermoplastic copolymer.

7. A method of direct attachment of at least one semiconductor chip to a substrate or module as claimed in claim 6, wherein the interposer sheet and conductive attachment materials are similar materials having matching properties and matching coefficients of thermal expansion.

8. A method of direct attachment of at least one semiconductor chip to a substrate or module as claimed in claim 2, wherein said step of fabricating the interposer sheet includes fabricating the interposer sheet with a layer of relatively weak adhesive on one side for attaching the interposer to a substrate or module, covered by a peel off sheet, and with a layer of relatively strong adhesive on a second side for attaching the plurality of chips to the interposer.

9. A method of direct attachment of at least one semiconductor chip to a substrate or module as claimed in claim 8, wherein said step of fabricating the interposer sheet includes laser ablating the interposer sheet to create via patterns matching the contact patters of the plurality of chips.

10. A method of direct attachment of at least one semiconductor chip to a substrate or module as claimed in claim 1, wherein the vias are filled with a conductive attachment material comprising a solution of a thermoplastic polymer and a conductive fine metal forming a paste.

11. A method of direct attachment of at least one semiconductor chip to a substrate or module as claimed in claim 10, wherein the conductive attachment material comprises a copolymer of polyimide and siloxane.

12. A method of direct attachment of at least one semiconductor chip to a substrate or module as claimed in claim 11, wherein the conductive fine metal comprises gold.

13. A method of direct attachment of at least one semiconductor chip to a substrate or module as claimed in claim 1, wherein the interposer is formed of a material selected from an elastomer, a filled elastomer, a thermoplastic polymer, and a thermoplastic copolymer.

14. A method of direct attachment of at least one semiconductor chip to a substrate or module as claimed in claim 11, wherein the interposer and conductive attachment materials are similar materials having matching properties and matching coefficients of thermal expansion.

15. A method of direct attachment of at least one semiconductor chip to a substrate or module as claimed in claim 1, wherein the chip is attached to the interposer with a first adhesive.

16. A method of direct attachment of at least one semiconductor chip to a substrate or module as claimed in claim 15, wherein the chip is attached to the substrate or module with a second adhesive which is not as strong in bonding strength as the first adhesive, to provide for rework in which the second adhesive is ruptured to detach the chip from the substrate or module while the first adhesive remains intact.

17. A method of direct attachment of at least one semiconductor chip to a substrate or module as claimed in claim 16, wherein following rupture, a pattern of conductive attachment material is applied locally onto the substrate or module.

18. A method of direct attachment of at least one semiconductor chip to a substrate or module as claimed in claim 1, wherein following the filling step, the chip is burned-in by contacting a burn-in module.

19. A method of direct attachment of at least one semiconductor chip to a substrate or module as claimed in claim 18, wherein the burn-in module is provided with a bump each via, and the radius of each bump on the burn-in module is larger than the radius of bumps of conductive attachment material provided on the substrated or module to ensure adequate composite flow during the step of directly attaching.

* * * * *

UNITED STATES PATENT AND TRADEMARK OFFICE
CERTIFICATE OF CORRECTION

PATENT NO. : 5,086,558

DATED : February 11, 1992

INVENTOR(S) : Gary W. Grube, et al.

It is certified that error appears in the above-identified patent and that said Letters Patent is hereby corrected as shown below:

On the title page, Section [54]: delete second occurrence of "SUBSTRATE WITH A"

Column 1, line 2: delete second occurrence of "SUBSTRATE WITH A"

Column 1, line 64: "Afterwards,." should read as --Afterwards,--

Column 6, line 57, Claim 1: "join" should read as --joint--

Column 7, line 12, Claim 3: ";substrate" should read as --substrate--

Column 7, line 20, Claim 4: "polymide" should read as --polyimide--

Column 8, line 19, Claim 14: "11" should read as --13--

UNITED STATES PATENT AND TRADEMARK OFFICE
CERTIFICATE OF CORRECTION

PATENT NO. : 5,086,558

DATED : February 11, 1992

INVENTOR(S) : Gary W. Grube, et al.

It is certified that error appears in the above-identified patent and that said Letters Patent is hereby corrected as shown below:

Column 8, line 48, Claim 19: "bump each" should read as --bump for each--

Column 8, lines 50-51, Claim 19: "substrated" should read as --substrate--

Signed and Sealed this

Seventeenth Day of August, 1993

*Attest:*

BRUCE LEHMAN

*Attesting Officer*    *Commissioner of Patents and Trademarks*